Figure 1:
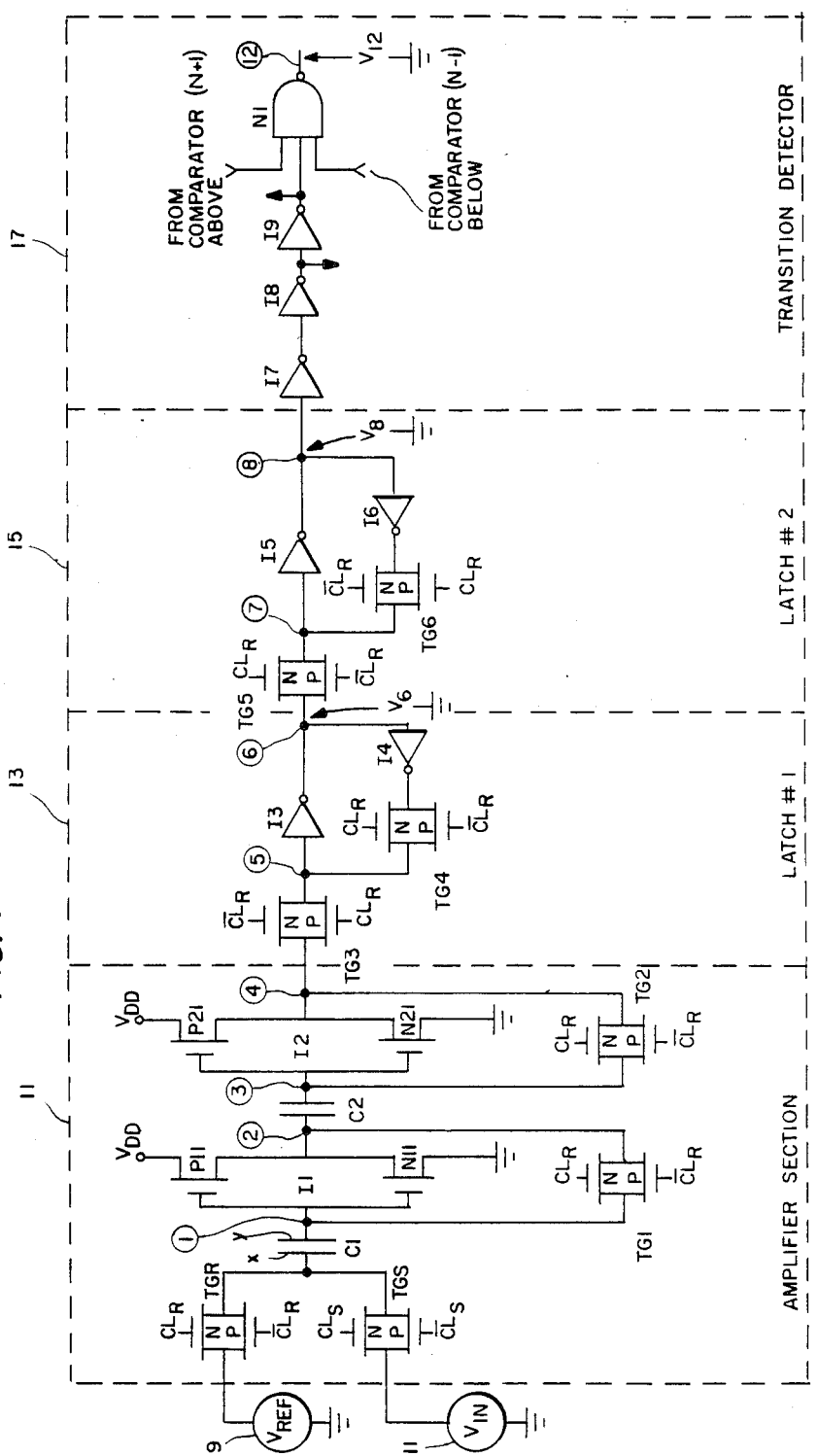

United States Patent [19]

Dingwall et al.

[11] Patent Number: 4,691,189

[45] Date of Patent: Sep. 1, 1987

[54] COMPARATOR WITH CASCADED LATCHES

[75] Inventors: Andrew G. F. Dingwall, Bridgewater Township, Somerset County; Victor Zazzu, Montvale Borough, both of N.J.

[73] Assignee: RCA Corporation, Princeton, N.J.

[21] Appl. No.: 866,317

[22] Filed: May 23, 1986

[51] Int. Cl.$^4$ .............................................. H03M 1/34
[52] U.S. Cl. ............................... 340/347 AD; 307/362
[58] Field of Search ................. 340/347 AP; 307/362, 307/300, 361, 363, 364; 328/146-149

[56] References Cited

U.S. PATENT DOCUMENTS 4,613,777 9/1986 Kible ..................................... 307/362

*Primary Examiner*—Charles D. Miller
*Attorney, Agent, or Firm*—Joseph S. Tripoli; Christopher L. Maginniss

[57] ABSTRACT

In a comparator circuit, first and second latchable circuits are connected in cascade between the output of an amplifying stage and the input of a decoder to enable the comparator to operate at significantly higher frequencies with lower error levels. An input signal, to be sampled, and a reference signal are applied to the input of the amplifying stage and a "sampled" signal indicative of the difference between the input and the reference is produced at the output of the amplifying stage. The "sampled" signal produced at the output of the amplifying stage is first processed, via the first latchable circuit operated in a regenerative mode to enhance the signal, during one time interval. The enhanced signal is then processed via the second latchable circuit operated in a regenerative mode tending to further enhance the signal, during a second, succeeding, time interval, for application to the decoder.

1 Claim, 2 Drawing Figures

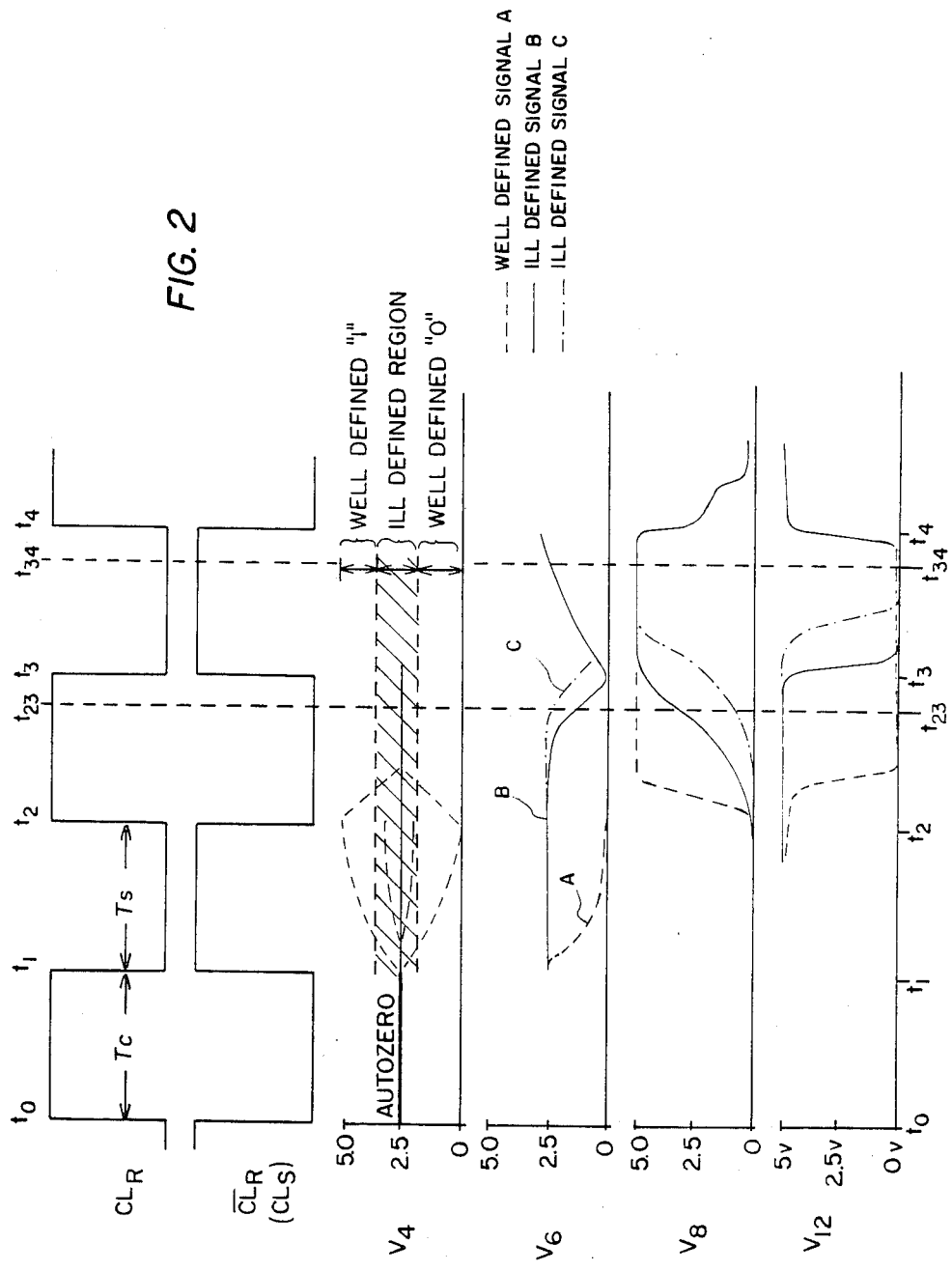

COMPARATOR WITH CASCADED LATCHES

This invention relates to analog-to-digital (A/D) converters and to an improved comparator circuit particularly useful in A/D converters.

In A/D converters, comparators are used to compare an input signal ($V_{IN}$) against a reference signal ($V_{REF}$). For example, in "flash" A/D converters, an array of comparators is used to sense the value of $V_{IN}$ as shown, for example, in FIGS. 1 and 2 of co-pending application of co-applicants, Andrew G. F. Dingwall and Victor Zazzu, titled "Intermeshed Resistor Network for Analog to Digital Conversion" bearing application Ser. No. 700,866, now U.S. Pat. No. 4,612,531 and assigned to the same assignee as this application, and whose teachings are incorporated herein by reference. Each comparator, of the array of comparators, has a different value of $V_{REFi}$ applied to it and each, ith, comparator includes means for sampling the input signal ($V_{IN}$), comparing the sampled signal against its applied value of reference voltage, $V_{REFi}$, to determine whether the input signal ($V_{IN}$) is more positive, or more negative, than its $V_{REFi}$. Each comparator then produces a high (e.g. $V_{DD}$ volts) level or a low (e.g. ground) level in response to, and indicative of, whether $V_{IN}$ is greater or less than its $V_{REFi}$.

Typically, each comparator includes means for sensing the difference between a $V_{IN}$ and a $V_{REFi}$ during one phase of a clock signal and applying the difference to an amplifier stage biased at its toggle point. On the next, subsequent, phase of the clock signal the output of the amplifier stage, which represents the sampled signal, is coupled to a latch circuit, which is intended to be driven to either a high level or to a low level condition in response to the amplified "sampled" signal at the amplifier output. The output of the latch circuit is then applied to a decoder.

It is known to connect a "single-latch" circuit to the amplifier output, with the latch functioning to generate binary valued signals [i.e. a "high" at, or close to, $V_{DD}$ volts or a "low" at, or close to, zero volts] in response to the signals applied to its input. The use of the single-latch is shown, for example, in the application Ser. No. 700,866, cited above, in an article entitled "Monolithic Expandable 6 Bit 20 MHz CMOS/SOS A/D Converter" by co-applicant Andrew G. F. Dingwall, published in *IEEE JOURNAL OF SOLID-STATE CIRCUITS*, Vol. SC-14, No. 6, December 1979, and in FIG. 1A of copending application of co-applicant Andrew G. F. Dingwall titled "Clock Shaping Circuit and Method" bearing application Ser. No. 782,579 filed 10-1-85, and assigned to the same assignee as this application, and whose teachings are also incorporated herein by reference.

Applicants discovered that, in many instances, erroneous results were produced at the output of the single-latch circuit. The erroneous results indicated a discontinuity in the input signal being sampled, where none existed, and caused what is known in the art as "sparkle" (i.e. a bright spot on a cathode ray monitor used to test A/D converter circuits containing the comparator circuitry). Applicants further discovered that these erroneous results occurred primarily when the comparator was being operated near the high end of its specified frequency ranges.

Applicant's invention resides, in part, in the recognition that the erroneous results and "sparkle" errors were due to the presence of a nearly-indeterminate or ill-defined signal condition at the input of the "single-latch". That is, applicants recognized that, although the output of the amplifier was applied to a latch operated in a regenerative mode, under some circumstances, the signals at the latch output were not driven to a full high or a full low level rapidly enough for error-free signal processing. Analysis revealed that the nearly-indeterminate or ill-defined condition occurred when the sampled signal at the output of the amplifier stage and into the latch was very close to the toggle point of the latch. This occurs when the sampled signal is very small resulting normally from $V_{IN}$ being equal or nearly equal to $V_{REF}$. For example, at high frequencies (e.g. 15 MHz), there was insufficient time, during one phase of a clock, for very small amplitude signal applied to the latch to be regeneratively amplified to a full digital valued (i.e. $V_{DD}$ or ground) signal. Applicants also recognized that with a single latch connected between the amplifier output and the decoding circuitry, the output of the single latch had to be defined in less than one full conversion cycle (i.e. one phase of the clock) in order to propagate the sampled signal in a timely fashion to the decoding circuitry.

In keeping with the above recognition, applicants' invention resides in means for buffering the output of a latch whose input is coupled to an amplifier stage for permitting regenerative action to occur within the latch for a full half-cycle of the system clock before the latch output is translated, or coupled, to decoding circuitry. Thus, in circuits embodying the invention, the "sampled" signal produced at the output of an amplifier stage and coupled to a latch is regeneratively amplified within the latch for at least one full half-cycle of the clock system before the latch output is coupled to decoding circuitry. Thus, applicants' invention resides in modification of known comparator circuitry for significantly reducing the erroneous results exhibited by the "sparkle" phenomenon.

Particular circuits embodying the invention include means, such as a second latch, connected between the output of the first latch and the input of the decoder circuitry to further enhance and regeneratively amplify the sampled signal before applying it to the decoder. The addition of a second latch reduces, significantly, the effect of nearly-indeterminate or ill-defined signals by providing additional time during which the sampled signal is regeneratively amplified.

Thus, in circuits embodying the invention, the speed capability of the comparator is improved (i.e. its specified operating frequency range is increased) by adding a second latch in series, or cascade, with a first latch whereby the already amplified "sampled" signal is regeneratively amplified by the first latch for one phase of a clock signal and is then passed to the second latch where it is also regeneratively amplified during a subsequent phase of the clock signal.

Simulation and testing of actual circuits embodying the invention reveal that the "cascaded latches" architecture, (i.e. the use of two or more latches in series in the signal path between the amplifier stage and the decoding stage) increases the speed of the flash A/D converter by improving the data rate through the actual decoding path.

In the accompanying drawing, like reference characters denote like components; and FIG. 1 is a schematic diagram of an improved comparator circuit embodying the invention; and FIG. 2 is a waveform diagram of signals associated with various points of the circuit of FIG. 1.

In the detailed discussion of the invention to follow, the operation of only one comparator circuit of a possible array of like comparators is discussed.

The circuit of FIG. 1, which shows part of the comparator section of an A/D converter includes a complementary transmission gate TGR, which is turned-ON and OFF by means of clock signals $CL_R$ and $\overline{CL_R}$, for selectively coupling a reference voltage source 9 of amplitude $V_{REF}$ to the "input" side (i.e. plate X) of a capacitor C1. A complementary transmission gate TGS, which is turned-ON and OFF by means of clock signals $CL_S$ and $\overline{CL_S}$, is used to selectively couple a source 11 of input signal, $V_{IN}$, to be sampled, to the input side of C1. The output side (i.e. plate Y) of C1 is connected to the input of an inverter I1 at node 1. Inverter I1 includes two insulated-gate field-effect transistors (IGFETs) P11 and N11, of complementary conductivity type, having their source electrodes connected to $V_{DD}$ and ground, respectively, their gate electrodes connected to inverter input node 1, and their drains connected to inverter output node 2. A transmission gate, TG1, is connected between nodes 1 and 2. When TG1 is enabled, the input and output of inverter I1 are connected via a low impedance path and are driven to the same potential. Inverter I1 is then driven to its "toggle" point and, for this condition, inverter I1 is referred to herein as being auto-zero'ed. The output of inverter I1 is coupled via capacitor C2 to the input of an inverter I2 comprised of complementary IGFETs P21 and N21 which are interconnected to form a complementary inverter I2 of the same type as I1. A transmission gate TG2 is connected between the input, node 3, and the output, node 4, of I2. TG1 and TG2 are concurrently enabled and disabled by means of clock signals $CL_R$ and $\overline{CL_R}$. Where the source-to-drain impedance ($Z_{P11}$) of P11 is equal to the source-to-drain impedance ($Z_{N11}$) of N11 for like bias conditions, input and output nodes, 1 and 2, of I1 are driven to $V_{DD}/2$ during the auto-zero portion of each cycle. Similarly, if the source-to-drain impedance ($Z_{P21}$) of P21 is equal to the source-to-drain impedance ($Z_{N21}$) of N21 for like bias conditions, input node 3 and output node 4 of I2 are driven to $V_{DD}/2$ during the auto-zero portion of each cycle.

The output at node 4 is applied to a first latchable circuit 13 (latch #1) comprised of transmission gate TG3 connected between node 4 and the input node 5 of an inverter I3. The output of inverter I3 is connected to the input of an inverter I4. The output of inverter I4 is connected via transmission gate TG4 to the input of inverter I3. In the circuit of FIG. 1, TG3 is turned-ON and TG4 is turned-OFF when the $CL_R$ signal is low and TG3 is turned-OFF and TG4 is turned-ON when $CL_R$ is high.

The circuit of FIG. 1 discussed so for is similar to prior art circuitry. However, at this point, note that a second latchable circuit #15 is introduced in cascade with latch #1 in the signal propagation path between the amplifier section 11 and the decoding circuitry 17. The significance of this additional latchable circuit, which is similar in structure to the first latch, is discussed in detail below.

The output (V6) of latch #1 at node 6, is coupled via transmission gate TG5 to the input, node 7, of latch #2 to which is connected the input of inverter I5. The output of inverter I5 is connected to node 8 which defines the output of latch #2 and to which is connected the input of an inverter I6 and the input of decoder circuit 17. The output of inverter I6 is coupled via transmission gate TG6 to node 7. In the circuit of FIG. 1, TG5 is turned-ON and TG6 is turned-OFF when $CL_R$ is high and TG5 is turned-OFF and TG6 is turned-ON when $CL_R$ is low.

One mode of operating the comparator of FIG. 1 is discussed below with reference to the waveforms of FIG. 2.

(1) During each conversion interval ($T_C$)—e.g., from time $t_0$ to $t_1$—and prior to the initiation of a sampling interval, $CL_R$ is high ($\overline{CL_R}$ is low) and $CL_S$ is low ($\overline{CL_S}$ is high). [For ease and simplicity of discussion, $CL_R$ and $CL_S$ have been assumed to be complementary. In practice, this is not so. $CL_R$ and $CL_S$ are shaped to ensure that TGR and TGS are not turned-ON simultaneously.] Transmission gates TGR, TG1, TG2, TG4, and TG5 are turned-ON and TGS, TG3 and TG6 are turned-OFF. As a result, inverters I1 and I2 are auto-zeroed and, assuming inverters I1 and I2 to be symmetrical, as discussed above, the potentials at nodes 1, 2, 3 and 4 will be driven to, or close to, $V_{DD}/2$. During the conversion time interval, since TGR is turned-ON, reference source 9 applies the reference voltage, $V_{REF}$, to input terminal X of capacitor C1 which is thus charged to the value of $V_{REF}$.

(2) At time $t_1$ the conversion interval terminates and the sampling interval begins. $CL_R$ and $\overline{CL_S}$ go low while $CL_S$ and $\overline{CL_R}$ go high turning-OFF transmission gates TGR, TG1, TG2, TG4 and TG5 and turning-ON TGS, TG3 and TG6. Since $CL_S$ goes high and $\overline{CL_S}$ goes low, TGS is turned-ON and the sampling interval ($T_S$) is initiated. The input voltage ($V_{IN}$), to be sampled, is then coupled via the enabled transmission gate TGS to the input of C1. If $V_{IN}$ is more positive than the $V_{REF}$ stored on C1, a positive voltage differential ($V_{IN}-V_{REF}$) is produced at node 1 which is then amplified and inverted by I1 and further amplified and inverted by I2 tending to produce a "high" voltage at the output (node 4) of I2. If $V_{IN}$ is less positive than the $V_{REF}$ stored on C1, a negative voltage differential is produced at node 1 which is amplified and inverted by I1 and further amplified and inverted by I2 tending to produce a "low" voltage at the output (node 4) of I2. During the sampling phase (i.e. between time $t_1$ and $t_2$) of each clock cycle, $CL_R$ remains low and transmission gates TGR, TG1, TG2, TG4 and TG5 are disabled.

(3) At time $t_2$ the sampling interval terminates and a new conversion interval is initiated as discussed above for time $t_0$ to $t_1$.

During each conversion interval with $CL_R$ being high and $CL_S$ being low the following circuit conditions and functions occur:

(a) TGR is turned-ON coupling $V_{REF}$ to plate x of capacitor C1 and TGS is turned-OFF decoupling $V_{IN}$ from the comparator circuit.

(b) TG1 and TG2 are turned-ON whereby each one of inverters I1 and I2 in amplifier section 11 is auto-zero'ed. Assuming the impedances of each P and N transistors of the inverter to be equal for like bias conditions, nodes 1, 2, 3 and 4 are driven to $V_{DD}/2$ volts.

(c) TG3 is OFF and TG4 is ON. Hence, latch #1 is in the regeneratively latching mode with the signals at nodes 5 and 6 being driven towards $V_{DD}$ and ground corresponding to the signal applied to node 5 during the preceding sampling interval.

(d) transmission gate TG5 is ON while transmission gate TG6 is OFF. For this condition, the signal being produced at the output (node 6) of latch #1 is being coupled via TG5 to node 7 and the signal at node 7 is amplified via inverter I5 producing an amplified signal ($V_8$) at node 8. However, note that latchable circuit 2 does not function as a latch during this interval.

(e) The output of latch #2 is applied to the input of transition detector 17. Each transition detector section includes 3 cascaded inverters (i.e. I7, I8 and I9) with the output of the third inverter being applied to one input of a 3-input Nand gate, N1. A second input to Nand gate N1 comes from the output of a comparator (n−1)—not shown, and the third input to Nand gate N1 comes from the output of a comparator (n+1)—also not shown. Comparators (n−1) and (n+1) represent neighboring comparators to the one shown in FIG. 1, where the neighboring comparators form part of an array of comparators all of whose outputs are decoded to sense the value of $V_{IN}$. Transitions are located from the condition output (n−1)="ONE", output (n)="ONE", Output (n+1)="ZERO". The three input Nand gate samples signals from the nth comparator shown in FIG. 1, and from each of the neighboring comparators (not shown), to locate, what is termed in the art as, a "thermometer" code transition from logic "0" to a logic "1". The comparator nearest the thermometer code transition is the comparator with $V_{REF}$ closest to the input voltage ($V_{IN}$). This comparator will normally have a value close to $V_{IN}$ and be subject to the problems discussed herein. The Nand gate generates a signal that is subsequently applied to a logic array that produces the proper binary code.

During each sampling interval ($CL_S$ is high and $CL_R$ is low) the following circuit conditions and functions occur:

(a) TGR is turned-OFF decoupling $V_{REF}$ from plate x of capacitor C1. TGS is turned-ON-coupling $V_{IN}$ to plate x of C1. As noted above, a value of $V_{IN}$ more positive than $V_{REF}$ by an amount $\Delta V$ causes the signal at node 1 to go to $[(V_{DD}/2)+\Delta V]$ volts while a $V_{IN}$ more negative than $V_{REF}$ by an amount $\Delta V$ causes the signal at node 1 to go to $[(V_{DD}/2)-\Delta V]$ volts.

(b) TG1 and TG2 are turned-OFF whereby I1 amplifies the signal at node 1 by $-A_1$ where $A_1$ is the gain of I1, producing a signal (V2) at node 2 of $[(V_{DD}/2)\pm A_1\Delta V]$ volts. The signal V2 is AC coupled via C2 to input node 3 and I2 amplifies the signal at node 3 by $-A_2$, where $A_2$ is the gain of I2, producing a signal (V4) at node 4 having a value of $[(V_{DD}/2) A_1 A_2 \Delta V]$ volts.

(c) TG3 is ON and TG4 is OFF whereby latch #1 is in its non-latching mode. The signal developed at node 4 is coupled via TG3 to the input of I3. Inverter I3 amplifies the signal present at node 5 and produces a signal (V6) at node 6 which is amplified by the gain ($A_3$) of I3.

(d) TG5 is OFF and TG6 is ON whereby latch #2 is in its regeneratively latching mode driving the signals at node 7 and 8 towards $V_{DD}$ and ground in response to the signal previously coupled from latch #1 (node 6) to node 8.

(e) The signal being produced at node 8 is coupled to the input of transition detector 17.

The significance of adding latch #2 and its role in enhancing the signal along the signal propagation path may be better explained with reference to FIG. 2.

As shown in the waveform for the signal V4 at node 4, output V4 of the amplifier section varies during the sampling interval, $t_1$ to $t_2$. At the end of the sampling interval, at time $t_2$, V4 may have a wide range of values. For ease of the discussion and illustration to follow, assume that the value of V4 may be classified in one of the following three categories:
1—Well defined "high" level; or
2—Well defined "low" level; or
3—Ill-defined or nearly-indeterminate level.

As will become evident in the discussion to follow, the well defined high or low levels rapidly produce well defined high or low levels at the output of latch #1. However, the signal in the ill-defined range may have insufficient amplitude to produce a defined high or low level at the output of latch #1 in the available time.

During the sampling interval ($t_1$ to $t_2$) the signal V4 is coupled via TG3 to node 5 of latch #1 and I3 produces a corresponding output V6 at node 6.

At the end of the sampling interval (time $t_2$), TG3 is turned-OFF and TG4 is turned-ON whereby the two inverters (I3 and I4) of latch #1 are cross coupled forming a regenerative latch. Hence, from time $t_2$ to $t_3$—during the conversion period—the signal at node 6 is amplified via I4 reinforcing the signal at the input (node 5) of I3 which further amplifies the signal into node 6. The regenerative action causes V5 and V6 to go either towards ground or $V_{DD}$.

The well defined "high" and "low" levels coupled to, and present at, node 5 at the end of the sampling interval ($t_2$) result in V5 at node 5 and V6 at node 6 being rapidly driven to very well defined "high" or "low" levels well before the latest decision time, $t_{23}$, occuring during the conversion period $t_2$ to $t_3$, as illustrated for waveform V6 in FIG. 2. The decision time $t_{23}$ is the latest time at which a full digital level corresponding to the sampled signal must be transferred to the subsequent transition detector and decoder.

However, note that the nearly-indeterminate or ill-defined levels coupled from V4 into latch #1 may not have reached a well-defined "high" or "low" level as quickly. See, for example, waveforms B and C of V6 in FIG. 2. Even though there is significant gain in the regenerative loop of latch #1 a finite time is needed to increase the level of the signal, and at high frequencies not enough settling or latching time is available to achieve full logic levels prior to time $t_{23}$. Consequently, if the output V6 of the first latch is directly applied to the input of decoder 17, as in the prior art, the decoder does not respond accurately. In the absence of latch #2, the signal V6 at node 6 has to be defined at time $t_{23}$, well before the end of the conversion interval. Thus, with a single latch only a portion of the conversion interval is available to enhance the sampled signal. By way of example, as shown in FIG. 2, with only latch #1 in circuit, the signal at the output of latch #1 needs to be well defined at a time $t_{23}$ to drive the transition detection logic and subsequent decoding circuitry accurately. Having to make the decision early (i.e. at time $t_{23}$) gives rise to a greater potential for error. With a single latch, the nearly-indeterminate levels applied to the latch result in erroneous read-outs indicating a discontinuity in the value of the input signal and "sparkle" when the part is tested, although no such discontinuity exists.

The addition of the second latch decreases the level of ambiguity and the lack of definition.

With latch #2 in the pipeline (i.e. propagation path), the signal in latch #1 can be processed (or conditioned) for the full conversion interval (i.e. time $t_2$ to $t_3$). Thus, by way of example, with latch #2 in cascade with latch #1, the time at which the output of latch #1 must be defined is extended to time $t_3$, instead of the time $t_{23}$ when a single latch is used. During the conversion cycle, the output (node 6) of latch #1 is coupled into the input (node 7) of latch #2. Thus, at the end of the conversion cycle (i.e. at time $t_3$), the maximum signal level developed in latch #1 is coupled to and present at the input (node 7) of latch #2. Thus, the signals applied to latch #2 at time $t_3$ have been increasing in level towards $V_{DD}$ and ground—for the full interval $t_2$ to $t_3$. The input signals to latch #2, at time $t_3$, have thus been extensively amplified and are closer to full digital levels ($V_{DD}$ or ground).

Therefore, the signal applied to the input of latch #2, although not necessarily well defined, is "better" defined than the signal applied half a cycle earlier to the input of latch #1. From time $t_3$ to $t_4$ (during a sampling interval) latch #2 is operated in the regenerative mode with I5 and I6 being cross-coupled. Hence, during each sampling interval, latch #2 continues the process of converting the sampled signal to either a well-defined high or low level. Thus, the signals at the output (node 8) of latch #2 are far better defined when they are finally applied to the detection logic circuit 17.

Thus, although the application of the sampled signal to the decoder is delayed by one-half cycle when translated through latch #2, this half-cycle is used to substantially enhance the amplitude of the sampled signal and to more clearly define its value. The use of the second latch thus provides additional settling time enabling the comparator to be operated at much higher frequencies. By way of example, a prior art "single" latch comparator, when operated at 15 MHz, was subject to periodic sparkling errors. The insertion of a second latch between the output of the first latch and the decoding circuitry increased the frequency at which time the comparator could be operated without "sparkle"-type errors by nearly a factor of 2.

The invention has been illustrated using 2 latches (i.e. double-latch scheme). However, it should be evident that additional latches could be connected in cascade to further reduce ambiguity and/or the ill defined output condition. However, it should be evident that at some point the additional latches may not provide significant improvement. This is because once sufficient time is provided for even the most minuscule signal to be driven to the $V_{DD}$ or zero volt condition, additional time and latches will not improve performance.

The invention has been illustrated using two regenerative latches connected in cascade between the output of the amplifier section and the input of the decoder section. However, it should be appreciated that the second latch could be replaced by an amplifying means selectively or directly coupled at its input to the output of the first latch and whose output would be directly or selectively coupled to the input of the decoding circuitry.

By way of example, this could be implemented by dynamically sampling the output of the first latch by means of a clocked transmission gate and storing the information on the gate capacitance of an inverter (such as I1 or I2) and then coupling the output of the inverter directly or by means of another clocked transmission gate to the input of the decoder. Although, this approach does not provide additional regenerative action, it does enable the first latch to regeneratively amplify the sampled signal for a full conversion cycle before the signal need be coupled to the decoder circuitry.

What is claimed is:

1. A comparator comprising:
    an amplifying stage having an input and an output;
    first means for selectively applying a reference signal to said input of said amplifying stage;
    second means for selectively applying an input signal to be sampled to said amplifying stage and for comparing said input signal with said reference signal and for producing a signal at the output of said amplifying stage indicative of the difference between said input signal and said reference signal;
    first and second latchable circuits, each one of said first and second circuits having an input and an output, each one of said first and second circuits being operable in either a first mode in which the circuit functions to receive data applied to its input or in a second mode as a regenerative latch;
    means for coupling the input of said first circuit to the output of said amplifying stage and means for coupling the output of said first circuit to the input of said second circuit;
    means coupled to said first and second circuits for operating said first circuit in said first mode and said second circuit in said second mode during one time interval and for operating said first circuit in said second mode and said second circuit in said first mode during a subsequent time interval; and
    a decoding means coupled to the output of said second circuit.

* * * * *